US010591961B2

(12) United States Patent
Abe (10) Patent No.: US 10,591,961 B2
(45) Date of Patent: Mar. 17, 2020

(54) TERMINAL DEVICE

(71) Applicant: FUJITSU CLIENT COMPUTING LIMITED, Kawasaki-shi, Kanagawa (JP)

(72) Inventor: Takashi Abe, Kawasaki (JP)

(73) Assignee: FUJITSU CLIENT COMPUTING LIMITED (JP)

(*) Notice: Subject to any disclaimer, the term of this patent is extended or adjusted under 35 U.S.C. 154(b) by 0 days.

(21) Appl. No.: 16/280,329

(22) Filed: Feb. 20, 2019

(65) Prior Publication Data

US 2019/0179379 A1    Jun. 13, 2019

Related U.S. Application Data

(63) Continuation of application No. PCT/JP2017/038064, filed on Oct. 20, 2017.

(30) Foreign Application Priority Data

Oct. 31, 2016  (JP) .................................. 2016-212765

(51) Int. Cl.
*G06F 1/18* (2006.01)
*H01R 13/73* (2006.01)
(Continued)

(52) U.S. Cl.
CPC .................. *G06F 1/18* (2013.01); *G06F 1/16* (2013.01); *H01R 12/79* (2013.01); *H01R 13/516* (2013.01);
(Continued)

(58) Field of Classification Search
CPC .. G06F 1/16; G06F 1/18; H01R 12/79; H01R 13/516; H01R 313/701; H01R 13/73; H01R 2201/06; H05K 7/12
See application file for complete search history.

(56) References Cited

U.S. PATENT DOCUMENTS

2013/0084756 A1* 4/2013 Hoshi .................. H01R 13/648
439/675

FOREIGN PATENT DOCUMENTS

JP   2009-016329 A    1/2009
JP    201079518 A *   3/2010
(Continued)

OTHER PUBLICATIONS

JP 2010-079518 Machine Translation, 2010 (Year: 2010).*
International Search Report for PCT/JP2017/038064, dated Dec. 5, 2017 (2 pages).

*Primary Examiner* — Jinhee J Lee
*Assistant Examiner* — Ingrid D Wright
(74) *Attorney, Agent, or Firm* — Harness, Dickey & Pierce, P.L.C.

(57) ABSTRACT

A terminal device including a first device and a second device includes at least one external connection terminal provided inside a housing of the first device and a hinge opening and closing the second device with respect to the first device. The hinge includes a bracket including a main body that holds an axis of the hinge and is fixed to an end portion of the housing of the first device and including an extension portion that extends to a position of the external connection terminal from the main body to abut on the external connection terminal and presses the external connection terminal toward an inner surface of the housing of the first device. Wobble of the external connection terminal is regulated by the bracket of the hinge.

3 Claims, 8 Drawing Sheets

(51) Int. Cl.
- *H01R 13/516* (2006.01)
- *H01R 12/79* (2011.01)
- *H05K 7/12* (2006.01)
- *G06F 1/16* (2006.01)
- *H01R 13/70* (2006.01)

(52) U.S. Cl.
CPC ........... *H01R 13/701* (2013.01); *H01R 13/73* (2013.01); *H05K 7/12* (2013.01); *H01R 2201/06* (2013.01)

(56) References Cited

FOREIGN PATENT DOCUMENTS

| | | |
|---|---|---|
| JP | 2010-177880 A | 8/2010 |
| JP | 2013-077519 A | 4/2013 |

\* cited by examiner

TERMINAL DEVICE

This application is a continuation application based on a PCT International Application No. PCT/JP2017/038064, filed on Oct. 20, 2017, whose priority is claimed on Japanese Patent Application No. 2016-212765, filed on Oct. 31, 2016. The entire contents of both the PCT International Application and the Japanese Application are incorporated herein by reference.

FIELD OF THE INVENTION

The present application relates to a terminal device including an external connection terminal.

DESCRIPTION OF RELATED ART

External connection terminals are mounted on terminal devices such as notebook-type personal computers (hereinafter, referred to as laptop computers). External connection terminals are, for example, power supply connectors supplying (charging) power supplies, universal serial bus (USB) connectors or the like for inputting and outputting data, or the like. Users usually insert and remove cables into and from external connection terminals attached to terminal devices. For this reason, a structure in which an external connection terminal is pressed against a housing is provided in the housing to reduce wobble at the time of insertion and removal and reduce stress on the external connection terminal due to the wobble. For example, Japanese Unexamined Patent Application, First Publication No. 2013-77519 and Japanese Unexamined Patent Application, First Publication No. 2009-16329 disclose a structure in which an external connection terminal is pressed against a housing using a protrusion, such as a rib of the housing, or a separate bracket.

SUMMARY OF THE INVENTION

According to an aspect, a terminal device is provided including a first device and a second device, the terminal device including at least one external connection terminal provided inside a housing of the first device, and a hinge opening and closing the second device with respect to the first device, in which the hinge includes a bracket including a main body that holds an axis of the hinge and is fixed to an end portion of the housing of the first device, and an extension portion that extends to a position of the external connection terminal from the main body to abut on the external connection terminal and presses the external connection terminal toward an inner surface of the housing of the first device.

BRIEF DESCRIPTION OF THE INVENTION

Hereinafter, an embodiment of the present application will be described in detail on the basis of a specific example with reference to the accompanying drawings. In addition, the same or similar components in the following embodiment will be denoted by common reference numerals and signs, and the sizes of these drawings are appropriately changed in order to facilitate understanding.

Figure 1A:
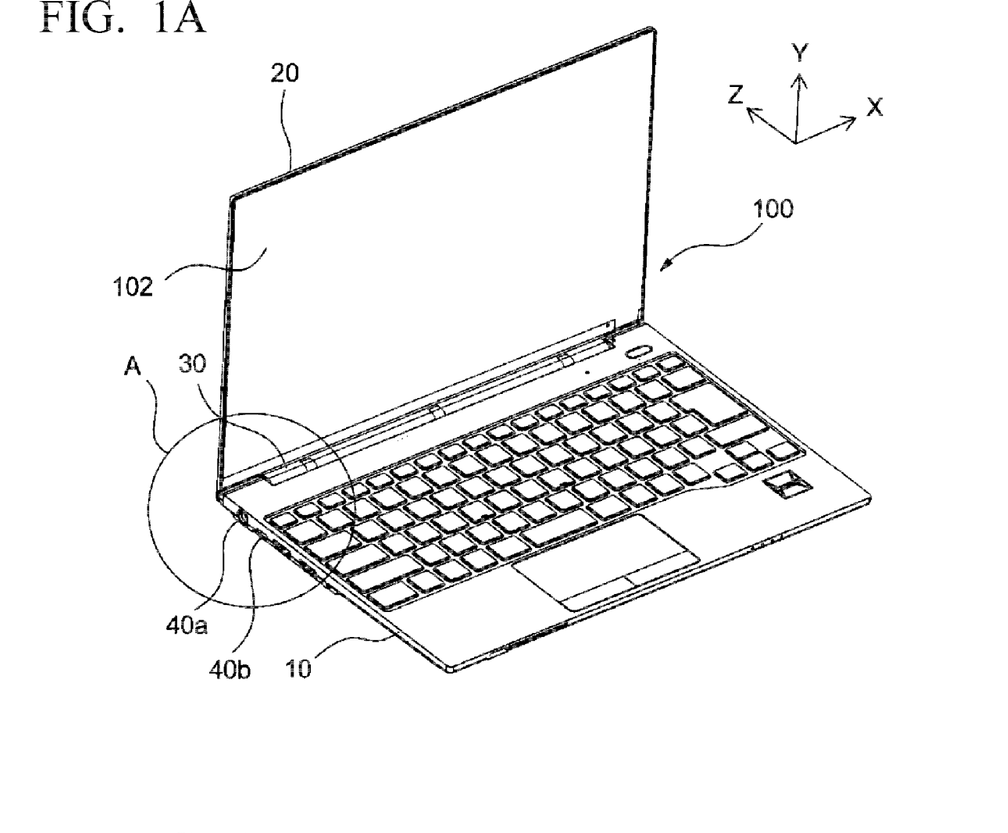
FIG. 1A is a perspective view illustrating a disclosed terminal device.
Figure 1B:
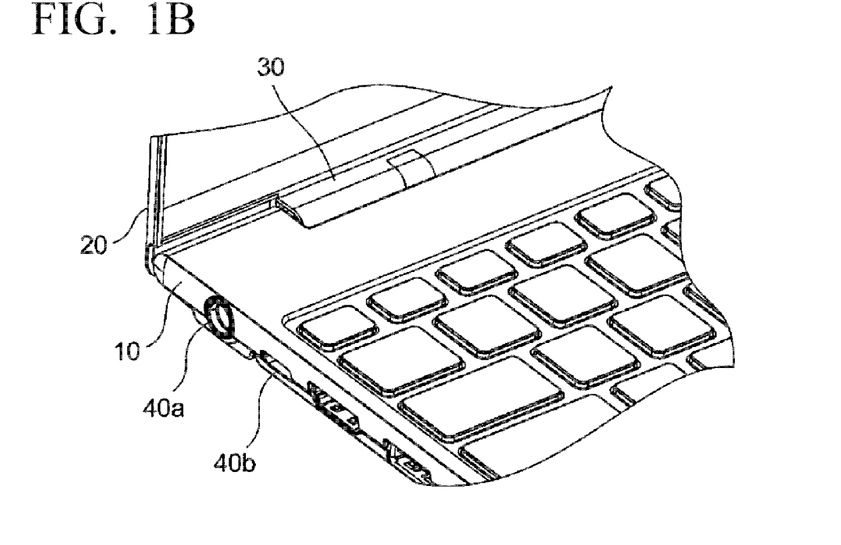
FIG. 1B is a partial perspective view of a portion A of FIG. 1A.

FIGS. 1A and 1B are perspective views illustrating a notebook computer 100 as an example of a terminal device according to the present embodiment. The notebook computer 100 includes a main body device 10 (an example of a first device) and a display device 20 (an example of a second device) which is opened and closed with respect to the main body device 10 through a hinge 30. FIG. 1A illustrates a state where the display device 20 is opened. In addition, hereinafter, a description will be given on the assumption that a direction of an arrow X illustrated in FIG. 1A is a right side in the width direction of the main body device 10 in a state where the notebook computer 100 is opened. Similarly, a description will be given on the assumption that a direction of an arrow Y illustrated in FIG. 1A is an upper side in the vertical direction of the main body device 10. Further, a description will be given on the assumption that a direction of an arrow Z illustrated in FIG. 1A is a rear side in the front-back direction of the main body device 10.

A circuit board having electronic parts such as a central processing unit (CPU), not shown in the drawing, mounted thereon is accommodated in the main body device 10. Input apparatuses such as a keyboard and touch pad are provided on the upper surface of the main body device 10. A display panel such as an LCD is provided in the display portion 102 of the display device 20, and the display panel is connected to the circuit board of the main body device 10 through cables or the like. As illustrated in FIG. 1B, external connection terminals 40a and 40b for connection to the circuit board are provided at the left end of the main body device 10. In the present embodiment, the external connection terminal 40a is a power supply connector for connection to a terminal of a power supply cable. In addition, the external connection terminal 40b is a universal serial bus (USB) connector and is connected to a terminal of a USB cable for inputting and outputting data or a terminal of a USB memory. In the external connection terminals 40a and 40b, insertion and removal of the terminal of the power supply cable or the terminal of the USB cable are frequently performed by a user.

Figure 2A:
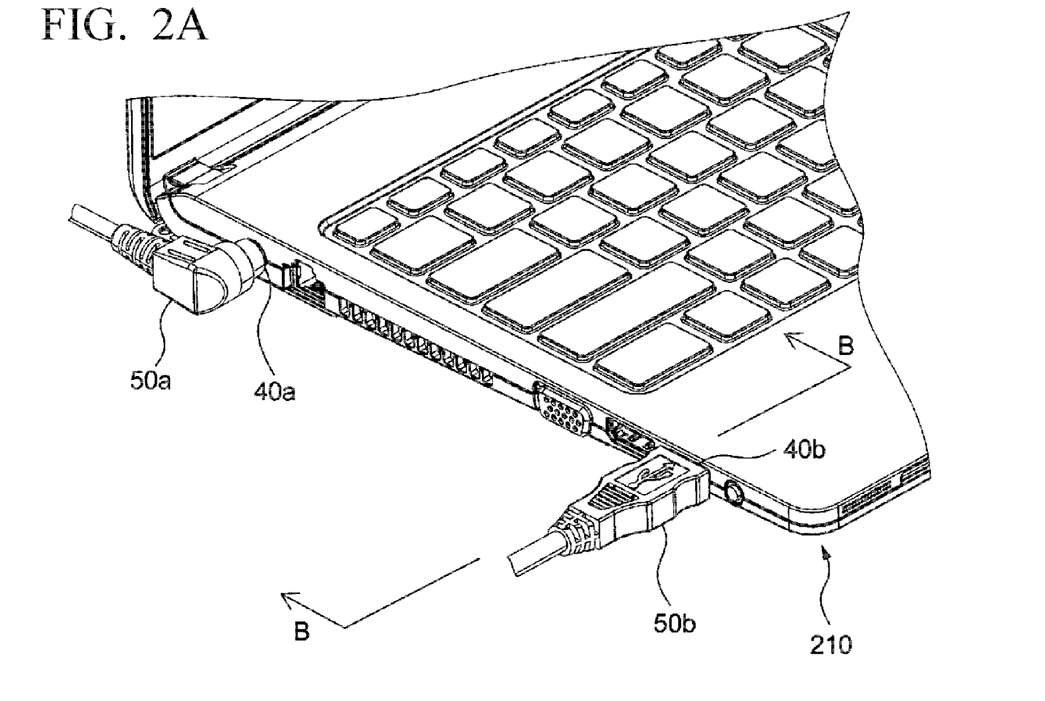
FIG. 2A is a partial perspective view of a terminal device according to a comparative technique.
Figure 2B:
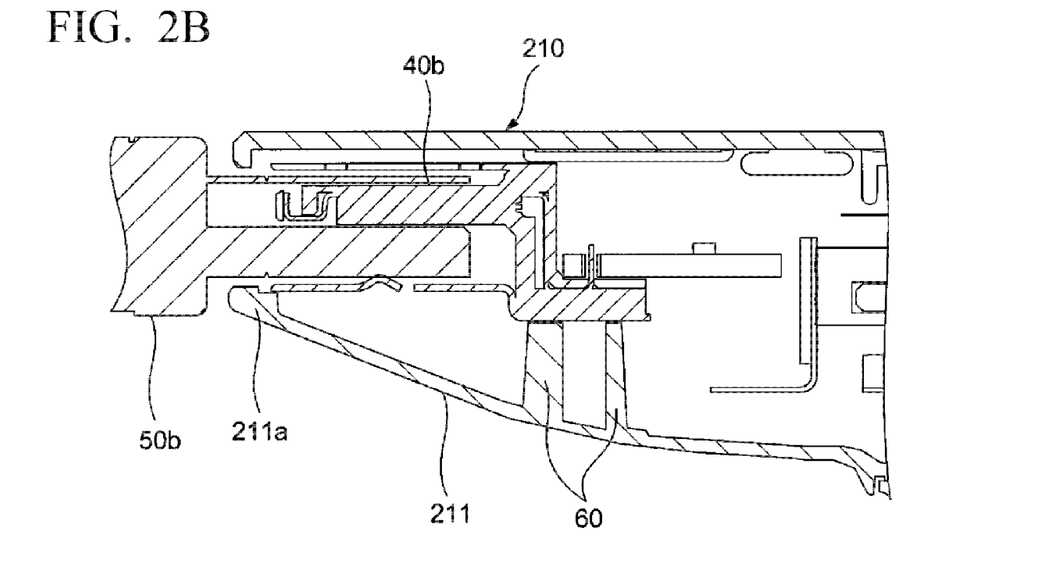
FIG. 2B is a partial cross-sectional view taken along a line B-B of FIG. 2A.

Here, a notebook computer as a terminal device according to a comparative technique will be described with reference to FIG. 2. FIG. 2A is a perspective view illustrating a left end of a main body device 210 of a notebook computer as a terminal device according to a comparative technique and illustrates a state where a terminal 50a of a power supply cable and a terminal 50b of a USB cable are respectively connected to external connection terminals 40a and 40b of the main body device 210. FIG. 2B is a cross-sectional view taken along a line B-B of FIG. 2A and is a diagram illustrating a structure in which the external connection terminal 40b is supported in the comparative technique.

As illustrated in FIG. 2B, in the notebook computer according to the comparative technique, the external connection terminal 40b is supported by an edge 211a of a housing 211 and ribs 60 formed inside the housing 211 so that wobble occurring at the time of inserting and removing the terminal 50b of the USB cable is regulated.

However, in order to make the notebook computer thinner, the housing 211 of the main body device 210 is manufactured through, for example, press forming of a metal plate, and thus the housing itself is made thin in the form of a plate. For this reason, it is difficult to provide the ribs 60 supporting the external connection terminal 40b in the housing so that the external connection terminal does not wobble.

Figure 3A:
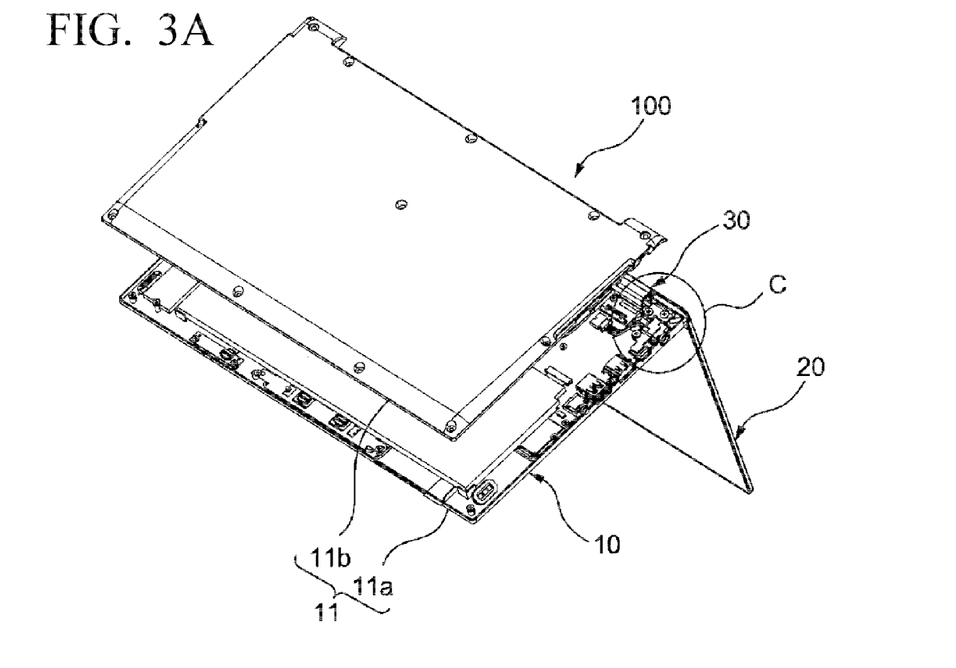
FIG. 3A is an exploded perspective view when seen from the bottom side of the disclosed terminal device.
Figure 3B:
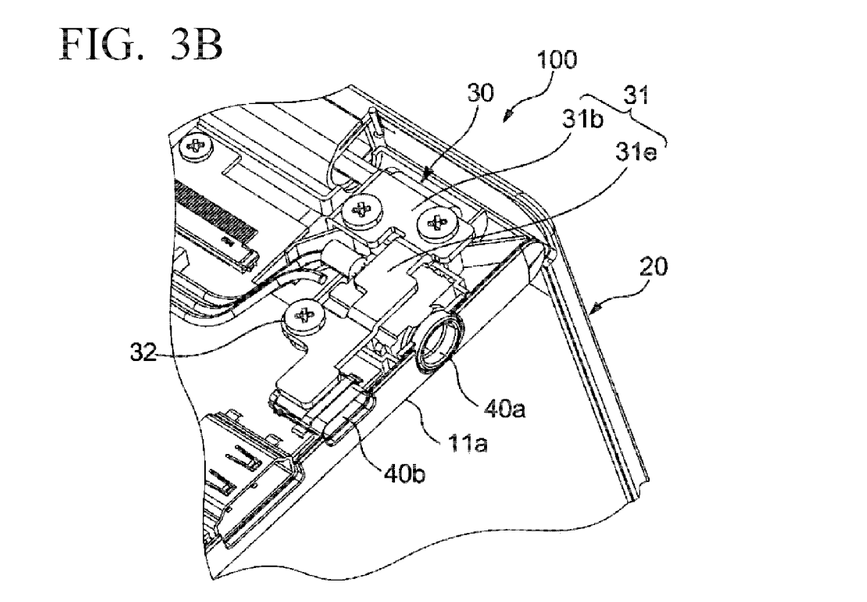
FIG. 3B is a partial perspective view of a portion C of FIG. 3A.

As illustrated in FIG. 1A and FIG. 3A to FIG. 6, the notebook computer 100 according to the present embodiment includes the hinge 30 including a bracket 31 extending to the position of the external connection terminal 40b from a hinge axis and the external connection terminals 40a and 40b. The external connection terminals 40a and 40b of the notebook computer 100 (hereinafter, the external connection terminals 40a and 40b may be collectively referred to as an external connection terminal 40) are a power supply connector and a USB connector, respectively, through which a relatively large number of times of insertion and removal are performed. The external connection terminal 40 is provided inside the housing 11. Further, in the notebook computer 100 according to the present embodiment, the external connection terminal 40 is provided on the rear side of the left end of the main body device 10 and in the vicinity of the hinge 30 (see FIGS. 1A and 1B). The housing 11 of the main body device 10 can be separated into an upper housing 11a and a lower housing 11b as illustrated in FIG. 3A. The bracket 31 includes a main body 31b and an extension portion 31e. The main body 31b holds the axis of the hinge 30 and is fixed to an end of the upper housing 11a. In addition, the extension portion 31e extends to the position of the external connection terminal 40b from the main body 31b to abut on the external connection terminal 40, and the extension portion 31e presses the external connection terminal 40 toward an inner surface 13a of the upper housing 11a. In addition, the bracket 31 is fixed to the upper housing 11a using a screw 32.

Figure 4:
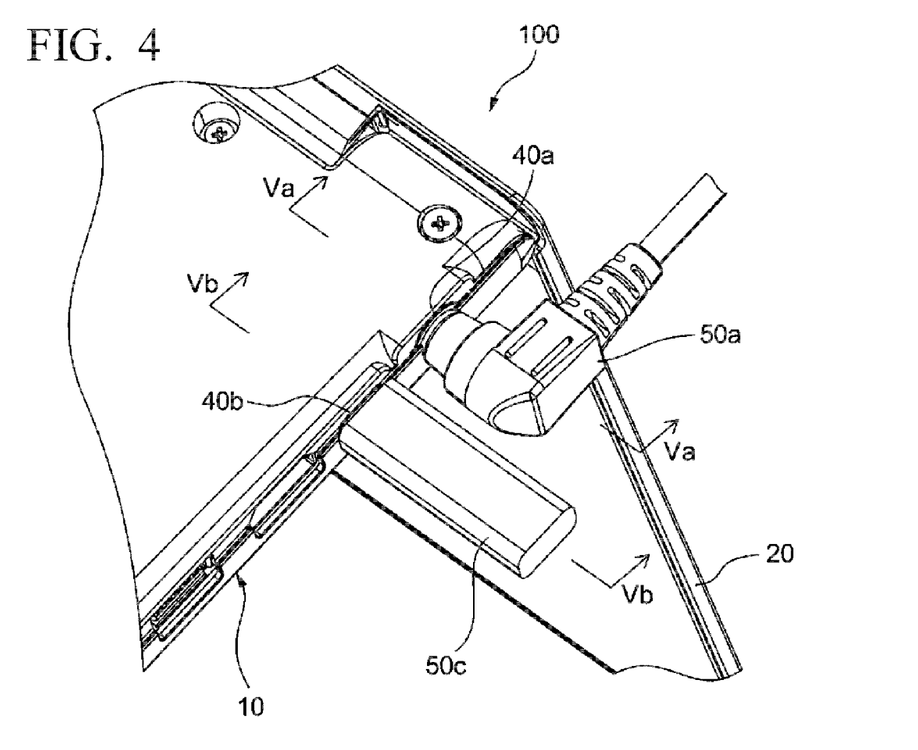
FIG. 4 is a partial perspective view when seen from the bottom side of the disclosed terminal device and illustrates a state where a cable and the like is inserted into the terminal device.
Figure 5A:
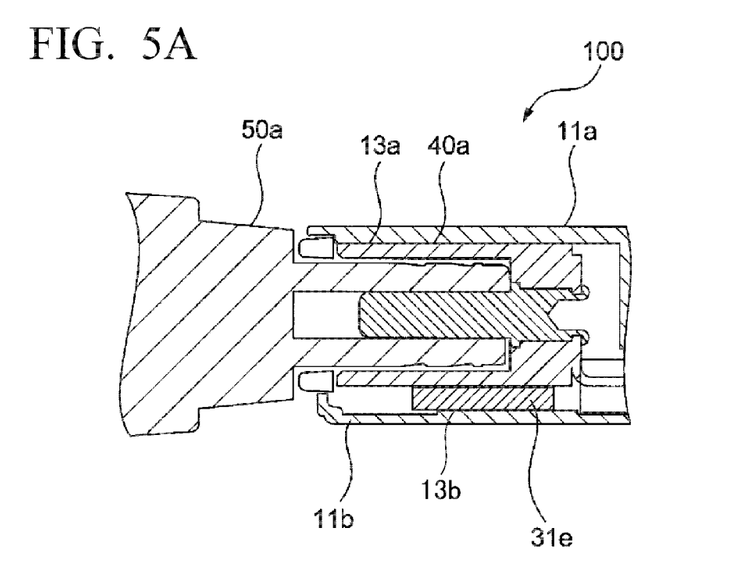
FIG. 5A is a cross-sectional view taken along a line Va-Va of FIG. 4.
Figure 5B:
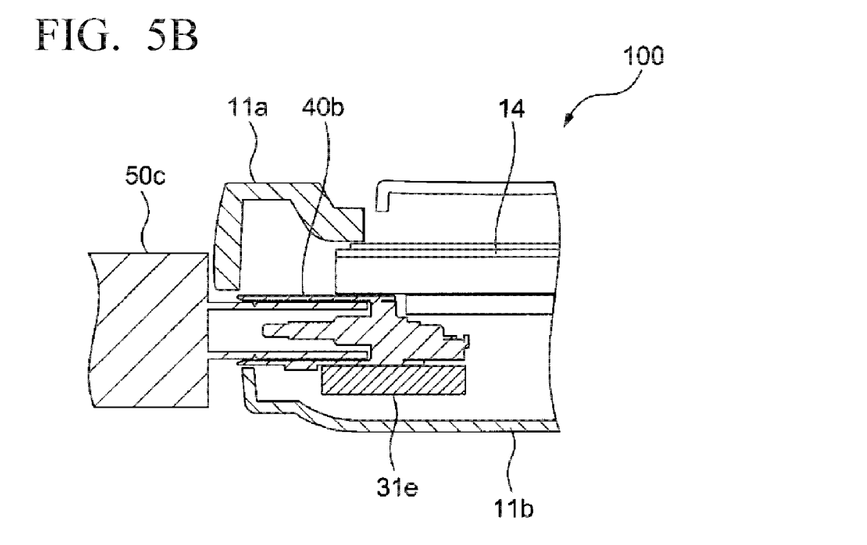
FIG. 5B is a cross-sectional view taken along a line Vb-Vb of FIG. 4.

FIG. 4 is a perspective view when the notebook computer 100 is seen from the bottom side thereof. FIG. 5A is a cross-sectional view taken along a line Va-Va of FIG. 4, and FIG. 5B is a cross-sectional view taken along a line Vb-Vb of FIG. 4. FIG. 4 illustrates a state where a terminal 50a of a power supply cable and a terminal 50c of a USB are respectively inserted into the external connection terminals 40a and 40b. As seen from FIG. 5A, the extension portion 31e of the bracket 31 abuts on the inner surface 13b of the lower housing 11b on an opposite side to a surface abutting on the external connection terminal 40a. Note that a clearance between the extension portion 31e of the bracket 31 and the lower housing 11b is set in a range in which the clearance can be compressed at the time of disposing the notebook computer 100 on a desk or the like and is provided so that there is no extreme gap.

With such a structure, when the notebook computer 100 is disposed on a desk or the like, the lower housing 11b and the extension portion 31e of the bracket 31 press the external connection terminal 40a toward the inner surface 13a of the upper housing 11a due to forces of their own weight. For this reason, the external connection terminal 40a is pressed so that the wobble of the external connection terminal 40a is regulated.

In FIG. 5B, although the lower housing 11b and the extension portion 31e of the bracket 31 do not directly abut on each other, the extension portion 31e of the bracket 31 extends from the main body 31b and is continuous. For this reason, the external connection terminal 40b is pressed by the bracket 31 being raised by the lower housing 11b toward the inner surface of the upper housing 11a similar to the external connection terminal 40a and toward a keyboard unit 14 provided in the upper housing 11a in the present embodiment. Accordingly, the wobble of the external connection terminal 40b is regulated.

Figure 6:
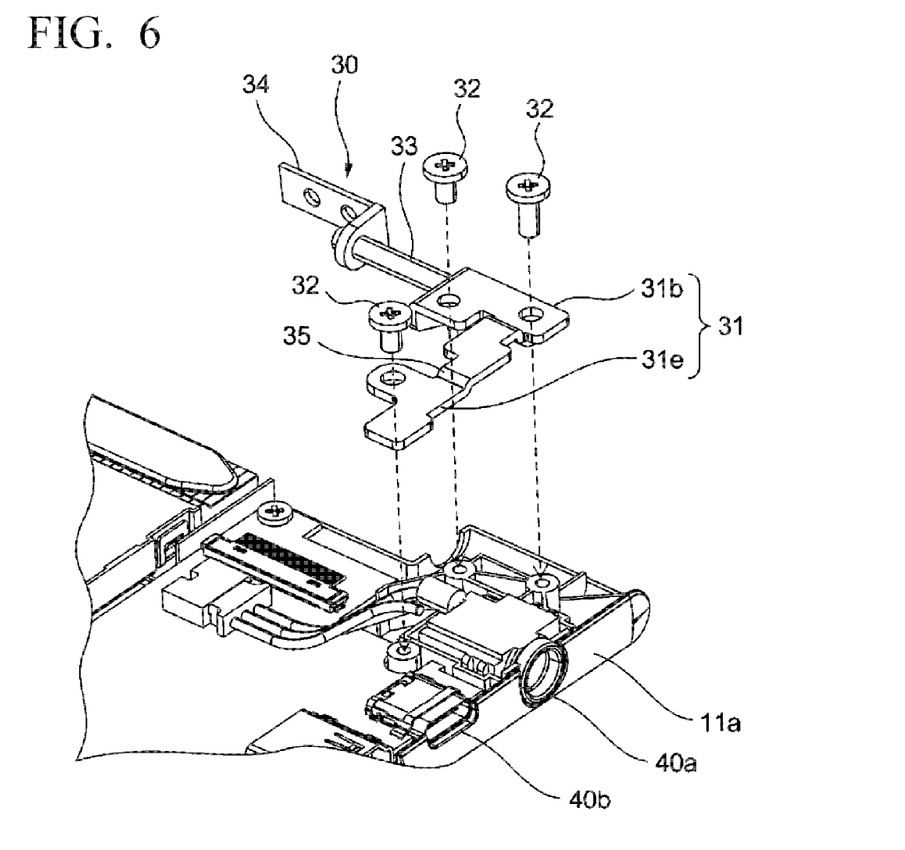
FIG. 6 is an exploded perspective view illustrating a hinge of the terminal device and is a diagram illustrating a state where the hinge is removed to attach an external connection terminal to the housing.

FIG. 6 is a perspective view illustrating the hinge 30. The hinge 30 includes a hinge axis 33, a fixation portion 34 holding the hinge axis 33 and fixed to the display device 20, and the bracket 31 holding the hinge axis 33 and fixed to the main body device 10. The bracket 31 includes the extension portion 31e that extends to the position of the external connection terminal 40 when the main body 31b is fixed to an end of the housing 11 of the main body device 10 as described above and presses the external connection terminal 40. In addition, a stepped portion 35 corresponding to the external form of the external connection terminal 40a is formed in the extension portion 31e of the bracket 31. It is possible to prevent, for example, shear of the external connection terminal 40a by fitting the external connection terminal 40a into the stepped portion 35.

As in the present embodiment, the external connection terminal 40 is pressed using the bracket 31 of the hinge 30 so that it is not necessary to separately form a rib for supporting the external connection terminal 40 in the lower housing 11b. For this reason, it is possible to manufacture a thin housing by enabling housing design through press forming of a sheet metal. In addition, since the number of portions separated from the hinge axis 33 is increased by the bracket 31 extending to the external connection terminal 40 in spite of a decrease in rigidity of the housing, it is possible to avoid local stress concentration on the housing 11 from the bracket 31. For this reason, it is possible to solve a problem that the rigidity of the thinned housing 11 is not sufficient.

In the present embodiment, although two external connection terminals 40a and 40b are pressed by the bracket 31, the number of external connection terminals 40 to be pressed against the bracket 31 may be one or three or more. In addition, although examples of the external connection terminal 40 are a power supply connector and a USB connector, the external connection terminal 40 may be an earphone jack connector, a monitor connection terminal for outputting a video to an external monitor, or the like. In addition, the external connection terminal 40 may be provided at the right end of the main body device 10, and the external connection terminal provided at the right end may be pressed toward the inner surface 13a of the upper housing 11a by a bracket (not shown) of a hinge provided on the right side.

Figure 7:
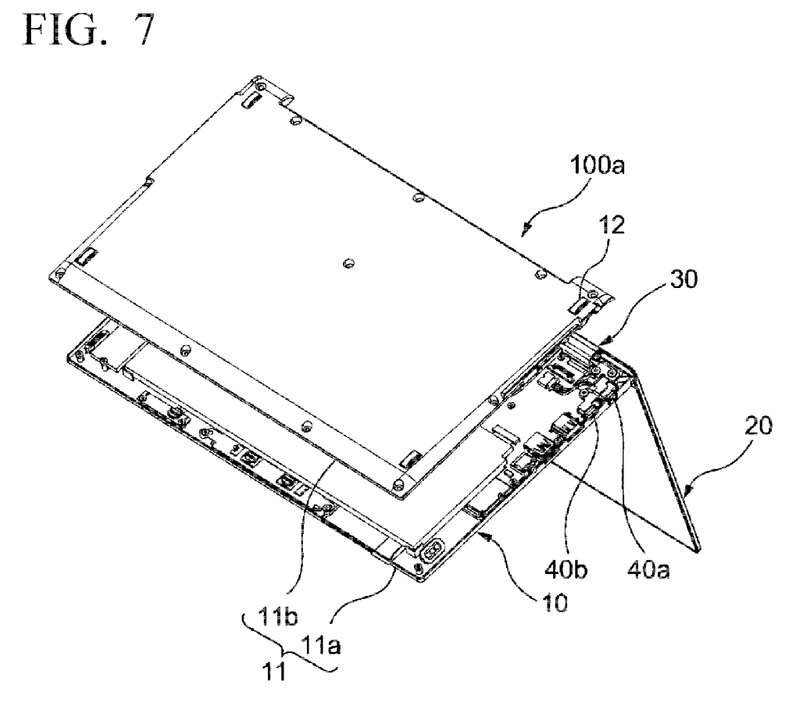
FIG. 7 is a diagram illustrating another example of a terminal device and is an exploded perspective view when seen from the bottom side of the terminal device.
Figure 8:
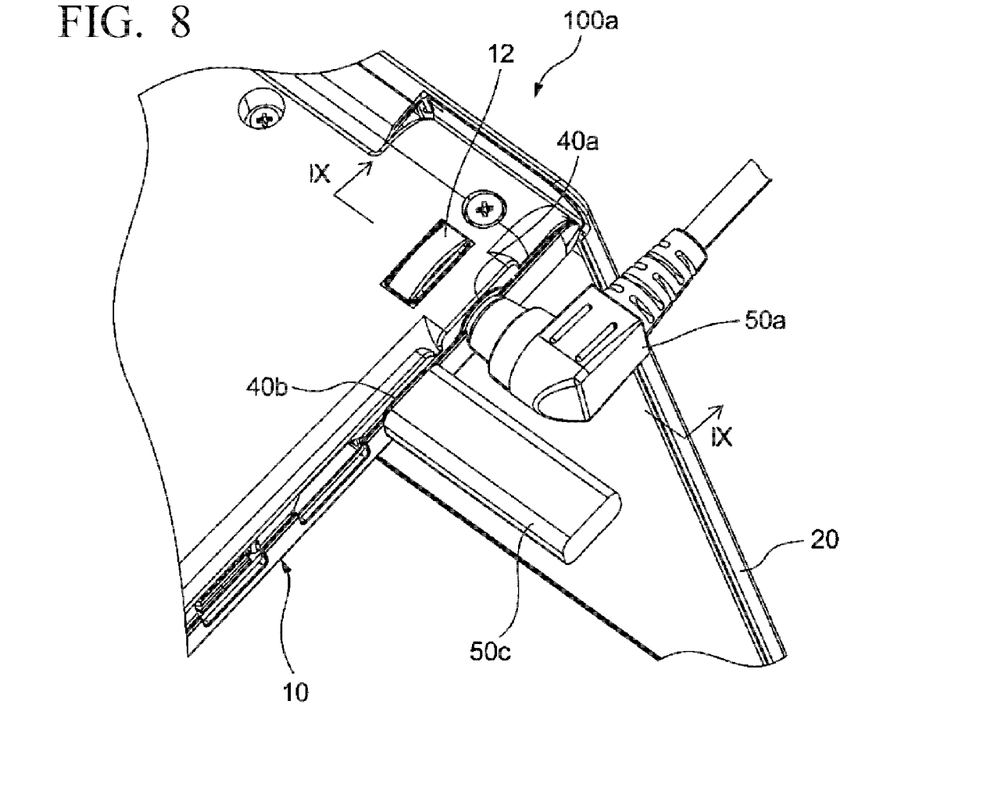
FIG. 8 is a diagram illustrating another example of a terminal device and is a partial perspective view when seen from the bottom side of the terminal device.
Figure 9:
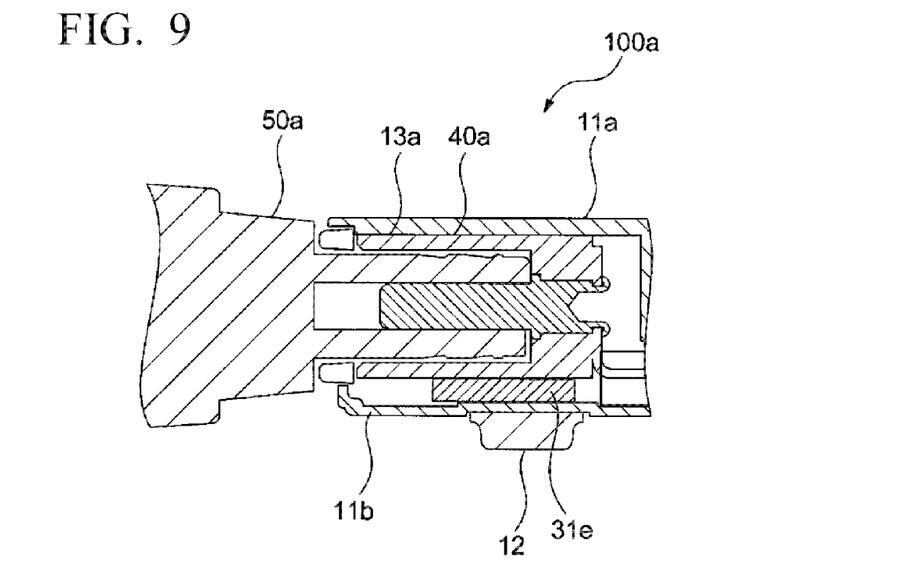
FIG. 9 is a cross-sectional view taken along a line IX-IX of FIG. 8.

A notebook computer 100a as another example of a terminal device will be described with reference to FIGS. 7 to 9. FIG. 7 is an exploded perspective view when the notebook computer 100a is seen from the bottom side thereof. FIG. 8 is a partially enlarged perspective view of the notebook computer 100a. FIG. 9 is a cross-sectional view taken along a line IX-IX of FIG. 8. The notebook computer 100a includes a hinge 30 including a bracket 31 extending to the position of an external connection terminal 40b from a hinge axis and includes external connection terminals 40a and 40b similar to the embodiment illustrated in FIGS. 3A to 6. As illustrated in FIG. 7, the notebook computer 100a further includes four legs 12 provided on the bottom surface of a main body device 10. Hereinafter, the leg 12 provided in the vicinity of the hinge 30 will be described. In addition, the housing 11, the bracket 31, and the external connection terminal 40 are the same as those in the notebook computer 100 illustrated in FIGS. 3A to 6, and thus a description thereof will be omitted.

The leg 12 is attached to support the weight of the main body device 10 of the notebook computer 100a at the time of disposing the notebook computer 100a on a desk or the like. In addition, as illustrated in FIG. 9, the leg 12 is attached to a lower housing 11b so as to be positioned below the extension portion 31e of the bracket 31 at the time of disposing the notebook computer 100a on a desk or the like. That is, the extension portion 31e of the bracket 31 is provided between the external connection terminal 40a and the leg 12. Note that, similarly to the notebook computer 100 illustrated in FIGS. 3A and 3B, a clearance between the extension portion 31e of the bracket 31 and the lower housing 11b is set in a range in which the clearance can be absorbed at the time of disposing the notebook computer 100 on a desk or the like and is provided so that there is no extreme gap.

With such a structure, when the notebook computer 100 is disposed on a desk or the like, the leg 12 presses the external connection terminal 40a toward the inner surface 13a of the upper housing 11a through the lower housing 11b and the extension portion 31e of the bracket 31 by a force of its own weight. Since a force of its own weight concentrates on the leg 12 as compared to a case in which the external connection terminal is pressed by only the lower housing 11b, the external connection terminal 40a is more strongly pressed, and wobble of the external connection terminal 40a is strongly regulated. Note that, although the leg 12 is made of rubber, the leg 12 may be made of, for example, a resin.

In addition, the legs 12 attached to the bottom surface of the housing 11 are positioned below the bracket 31 of the hinge 30 so that a load applied at the time of opening and closing the hinge 30 or at the time of operating a screen can be received on ground surfaces of the legs 12 through the bracket 31. For this reason, it is possible to secure stability of the notebook computer 100a.

In addition, it is possible to also use the weight of the notebook computer 100a for a force pressing the external connection terminal 40 against the housing 11 because of a structure in which the legs 12, the extension portion 31e of the bracket 31, and the external connection terminal 40 are superimposed on each other. For this reason, it is possible to, for example, thin the housing and achieve a further reduction in the weight of the terminal device by taking rigidity and balance of the weight of the device into account. In addition, the bracket 31 of the hinge 30 fixes the hinge 30 to the housing 11 and presses the external connection terminal 40 so that it is possible to reduce the number of parts, the volume, and the number of attachment steps as compared to a case in which each of the processes is performed by a different member.

Note that, in the above-described notebook computers 100 and 100a, the external connection terminal 40 is attached to the upper housing 11a, and thus the bracket 31 is fixed to the upper housing 11a of the main body device 10 through the screw 32, and the external connection terminal 40 is pressed on the upper housing 11a side. On the other hand, the external connection terminal 40 may be attached to the lower housing 11b by disposing a circuit device or the like in the lower housing 11b in contrast to the notebook computers 100 and 100a according to the present embodiment. In such a case, the extension portion 31e of the bracket 31 may be fixed to the lower housing 11b to press the external connection terminal 40 against the lower housing 11b side. In this case, the external connection terminal 40 is interposed between the bracket 31 and the leg 12.

The present application has been described above in detail with reference to the preferred embodiment.

What is claimed is:

1. A terminal device comprising:
    a first device having a housing, the housing having first and second inner surfaces facing to each other;
    at least one external connection terminal provided inside the housing of the first device;
    a second device configured to be pivotable relative to the first device; and
    a hinge having a bracket, the second device opening and closing with respect to the first device via the hinge, the hinge being connected between the first and second devices without being fixed to the external connection terminal,
    wherein the bracket is configured with:
        a main body that holds a hinge shaft of the hinge and is fixed to an end portion of the housing of the first device; and
        an extension portion that extends to the external connection terminal from the main body, the extension portion abutting against the external connection terminal, the extension portion pressing the external connection terminal toward the first inner surface of the housing of the first device due to a force of a weight of the terminal device.

2. The terminal device according to claim 1,
    wherein the extension portion of the bracket has first and second surfaces facing each other, the first surface of the extension portion presses the external connection terminal toward the first inner surface of the housing, and at least a portion of the second surface of the extension portion abuts against the second inner surface of the housing of the first device at a first position, and
    the first device includes a leg on a bottom surface of the housing at a second position corresponding to the first position, and the leg presses the external connection terminal toward the first inner surface of the housing via the extension portion of the bracket when the leg supports a weight of the first device.

3. The terminal device according to claim 1,
    wherein the extension portion of the bracket includes a stepped portion formed according to an external form of the external connection terminal.

* * * * *